US006332209B1

United States Patent
Eroz et al.

(10) Patent No.: US 6,332,209 B1
(45) Date of Patent: Dec. 18, 2001

(54) METHOD FOR A GENERAL TURBO CODE TRELLIS TERMINATION

(75) Inventors: Mustafa Eroz, Germantown; A. Roger Hammons, Jr., North Potomac, both of MD (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/378,625

(22) Filed: Aug. 20, 1999

Related U.S. Application Data
(60) Provisional application No. 60/098,111, filed on Aug. 27, 1998.

(51) Int. Cl.[7] .......................... H03M 13/23; H03M 13/29
(52) U.S. Cl. ............................................. 714/790; 714/792
(58) Field of Search ..................................... 714/790, 792

(56) References Cited

U.S. PATENT DOCUMENTS

| | | | |
|---|---|---|---|
| 5,721,745 | 2/1998 | Hladik et al. | ........................... 371/43 |
| 6,023,783 | * 2/2000 | Divsalar et al. | ....................... 714/792 |
| 6,289,486 | * 9/2001 | Lee et al. | ............................... 714/788 |

FOREIGN PATENT DOCUMENTS

19520987A1    12/1996    (DE).

WO 99/07076    2/1999    (WO).

OTHER PUBLICATIONS

D. Divsalar & F. Pollara, Turbo Codes for PCS Applications, Jun. 18, 1995, pp. 54–59.

* cited by examiner

*Primary Examiner*—Stephen M. Baker
(74) *Attorney, Agent, or Firm*—John T. Whelan; Michael W. Sales

(57) ABSTRACT

A method of terminating two or more constituent encoders of a turbo encoder employing a turbo code, comprising the step of: generating tail input bits at each of two or more constituent encoders, including deriving the tail input bits from each of the two or more constituent encoders separately from a contents of shift registers within each of the two or more constituent encoders, after an encoding of information bits by the two or more constituent encoders; puncturing one or more tail output bits such that 1/R output tail bits are transmitted for each of a plurality of trellis branches, wherein R is a turbo code rate employed by the turbo encoder during an information bit transmission. In yet another variation, the step of puncturing the tail output bits further comprises the step of: transmitting, during trellis termination, the tail output bits, only if they are sent from an output branch of one of the two or more constituent encoders that are used during information bit transmission.

7 Claims, 1 Drawing Sheet

TURBO CODE ENCODER

METHOD FOR A GENERAL TURBO CODE TRELLIS TERMINATION

This applications claims benefit of U.S. Provisional Application Ser. No. 60/098,111, filed Aug. 27, 1998.

BACKGROUND OF THE INVENTION

The present invention relates to methods for terminating both of the constituent encoders of a turbo code and developing puncturing patterns applicable at a trellis termination stage that ensures the same number of transmitted bits for each trellis stage during the information bit transmission and trellis termination stages.

The process of forward and reverse link turbo encoding and decoding, specifically for Code Division Multiple Access (CDMA) communications channels, is thoroughly described in copending U.S. patent application Ser. No. 09/248,338 of Eroz, et al., for SETS OF RATE-COMPATIBLE UNIVERSAL TURBO CODES NEARLY OPTIMIZED OVER VARIOUS RATES AND INTER-LEAVER DELAYS, filed Feb. 11, 1999, and copending U.S. patent application Ser. No. 09/235,582, of Eroz, et al., for FORWARD ERROR CORRECTION SCHEME FOR DATA CHANNELS USING UNIVERSAL TURBO CODE, filed Jan. 22, 1999, both of which are incorporated herein by reference.

In a convolutional encoding scheme, tail bits are inserted after information bits, to zero out all shift registers of an encoder. For feed forward encoders, tail bits are equal to zero. For feedback encoders the value of tail bits depend on the contents of the shift register current values.

A turbo encoder consists of a parallel concatenation of two (2) or more recursive (feedback) convolutional encoders. Because each constituent encoder processes the information bits in a different order due to a turbo interleaver, it is not possible to terminate all constituent encoders by the same tail bits.

A trellis termination method general enough to be used for a set of turbo codes with different code rates as in the third generation CDMA systems is desirable. Included in the desirable general method is a method of puncturing tail bit sequences.

SUMMARY OF THE INVENTION

The present invention advantageously addresses the needs above as well as other needs by providing a method and apparatus for a general Turbo Code trellis termination which may be employed when a turbo encoder operates within a wide range of turbo code rates when transmitting information bits.

In its most general form, the invention can be characterized as a method of terminating two or more constituent encoders of a turbo encoder. The method comprises the steps of: generating tail input bits at each of two or more constituent encoders, including the step of deriving the tail input bits from each of the two or more constituent encoders separately from the contents of shift registers within each of the two or more constituent encoders, after an encoding of information bits by the two or more constituent encoders; and puncturing one or more tail output bits such that 1/R tail output bits are transmitted for each of a plurality of trellis stages, wherein R is a turbo code rate employed by the turbo encoder during the information bit transmission.

In yet another variation, the step of puncturing the one or more tail output bits further comprises the step of: transmitting, during trellis termination, the tail output bits only if they are sent from an output branch of one of the two or more constituent encoders that is used during information bit transmission.

BRIEF DESCRIPTION OF THE DRAWINGS

The above and other aspects, features and advantages of the present invention will be more apparent from the following more particular description thereof, presented in conjunction with the following drawings wherein.

Corresponding reference characters indicate corresponding components throughout the several views of the drawings.

DETAILED DESCRIPTION OF THE PREFERRED EMBODIMENT

Figure 1:
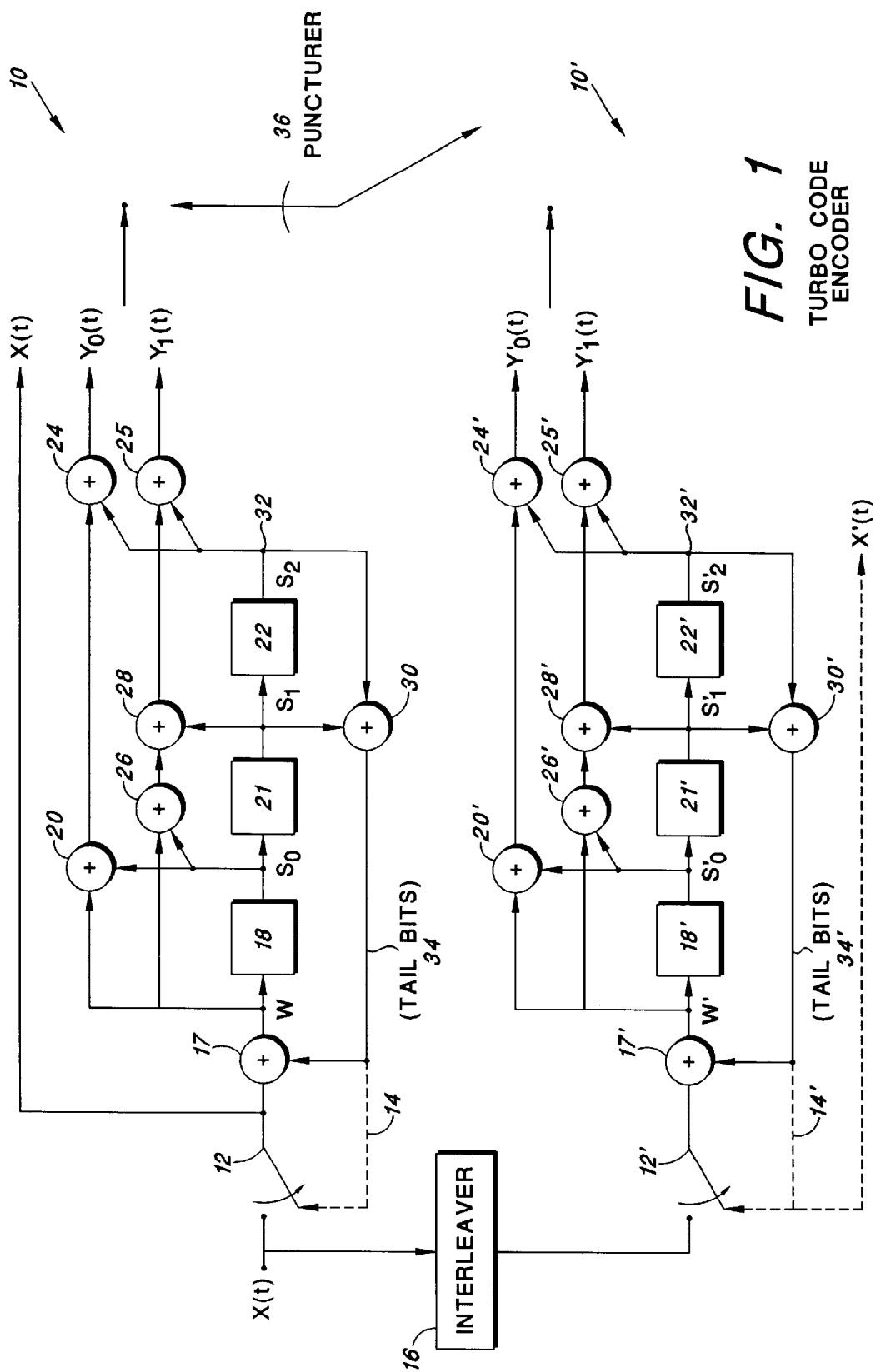
FIG. 1 is a block diagram of a turbo encoder with interleaved bits entering a second encoder, for use in accordance with one embodiment of the present invention.

The following description of the presently contemplated best mode of practicing the invention is not to be taken in a limiting sense, but is made merely for the purpose of describing the general principles of the invention. The scope of the invention should be determined with reference to the claims.

Referring to FIG. 1, an exemplary turbo code encoder is shown wherein one embodiment of a Turbo Code trellis termination design terminates one encoder 10 (a first encoder) while disabling another encoder 10' (a second encoder) and at a different time terminates the other encoder 10' (second encoder) while disabling the encoder 10 (first encoder).

The encoders (first and second encoders) 10, 10' of the turbo code encoder of FIG. 1 are constituent encoders configured in a parallel concatenation. It is well known in the art that a constituent encoder employ a configuration of modular adders 17, 20, 26, 28, 30, 24, and 25, and shift registers 18, 21, 22, coupled through nodes (such as node 32) to produce output bits, including tail output bits, X(t), $Y_0(t)$, $Y_1(t)$, for example, depending upon the encoding scheme. FIG. 1 is just one example of such a parallel concatenation of constituent encoders, wherein an interleaver device (Interleaver) 16 is employed between an input for X(t) and the second encoder 10', and wherein additionally, a puncturer 36 is employed, switchably coupled to respective encoder outputs for each of the encoders (first and second encoders) 10, 10'. As described herein, tail input bits will mean the bits X, and X' in FIG. 1, and tail output bits will mean the bits X, X', $Y_0$, $Y_0'$, $Y_1$ or $Y_1'$. In other turbo encoders, there may be more than two constituent encoders. Each of the constituent encoders may utilize a fewer or greater number of shift registers than in FIG. 1.

In FIG. 1, after message bits X(t) are encoded, a switch 12 is moved to a feedback position to allow the generation of three (3) consecutive tail input bits, in this example, generated from the contents of each of three shift registers 18, 21, and 22 (also referred to herein as a first shift register 18, a second shift register 21, and a third shift register 22). In general, a number of tail input bits X(t), X'(t) for terminating a constituent encoder is equal to a number of shift registers in that encoder.

At the end of each clock cycle, new tail input bits X(t), X'(t) are generated for zeroing out each respective shift register of the three shift registers, 18, 21 and 22.

In one embodiment of the invention the encoders 10, 10' are terminated simultaneously within three clock cycles, each with its own tail input bit X(t), X'(t). Alternatively, the first encoder 10 is first terminated while the second encoder 10' is disabled, followed by the second encoder 10' being terminated while the first encoder 10 is disabled.

In the variation with the encoders 10, 10' terminated at different times the encoders 10, 10' can be terminated in consecutive clock cycles, wherein six (6) consecutive clock cycle tail input bits X(t), X'(t), consecutively terminate both the encoders 10, 10'.

As can be seen from FIG. 1, a second tail input bit sequence 34' for terminating the second encoder 10' is fed back into the second encoder 10' through a switch 12' and circuit 14'. Tail input bits X(t), X'(t) are not interleaved by the turbo interleaver 16. Similarly, a tail input bit sequence 34 for terminating the first encoder 10 is fed back into the first encoder 10 through another switch 12 and another circuit 14.

The zeroing of the shift registers 18, 21, 22, prior to implementing a puncturing scheme per an embodiment of the invention, is triggered by a beginning and an ending tail input bit sequence X(t), X'(t), each sequence having a number n of tail input bits X(t), X'(t) equal to the number n of shift registers 18, 21, 22 or 18', 21, 22 coupled to each one of the encoders 10, 10'.

As with information and coded bits, tail output bits X, $Y_0$, $Y_1$, X', $Y_0'$, $Y_1'$ are also punctured by the puncturer 36.

Table 1 indicates associated tail output bit puncturing patterns having indicator sequences (e.g., "111 000") identifying which bits to puncture and which bits to transmit. The indicator sequence, comprising "1"'s or "0"'s is selected in accordance with an encoder rate. In this notation, "1" indicates the tail output bit should be transmitted and "0" indicates that the tail output should be punctured. Certain entries in Table 1 are labeled "repeat", which means that transmitted bits are transmitted twice.

The tail input bit sequences 34, 34', which comprise tail input bits X, and X', are generated after the encoders 10, 10' encode the information bits with the switches 12, 12' (FIG. 1), while the switches 12, 12' are in an up position. The first n/R tail output bits $X_1$, $Y_0$, $Y_1$, wherein n is the number of shift registers 18, 21, 22 or 18', 21', 22' per constituent encoder (n=3 in FIG. 1), and wherein R is a turbo code rate being employed, are generated by clocking the first encoder 10 n times with its switch 12 in the down position while the second encoder 10' is not clocked, and puncturing or repeating the resulting tail output bits $X_1$, $Y_0$, $Y_1$, X', $Y_0$, $Y_1'$ according to Table 1 below. The last n/R tail output bits X', $Y_0'$, $Y_1'$ are generated by clocking the second encoder 10' n times with its switch 12' in the down position while the first encoder 10 is not clocked, and puncturing or repeating the resulting tail output bits according to Table 1. These final output bits are denoted by X', $Y_0'$ or $Y_1'$.

For rate ½ turbo codes, the tail output bits for each of a first n tail input bit (also referred to and the tail output bits for each of a last n tail bit periods (also referred to herein as "the ending tail bit sequence X'(t)", are X'$Y_0'$. For rate ⅓ turbo codes, the tail output bits for each of the first n tail input bits are XX$Y_0$, and the tail output bits for each of the last n tail bits are X'X'$Y_0'$. For a rate ¼ turbo code, the tail output bits for each of the first n tail input bits are XX$Y_0Y_1$ and the tail output bits for each of the last n tail input bits periods are X'X'$Y_0'Y_1'$.

Tail inputs bits are not interleaved by the interleaver 16. They are added after the encoding of the information bits.

TABLE 1

Puncturing Patterns for Tail Output Bits

| Rate | ½ | ⅓ | ¼ |
|---|---|---|---|
| X(t) | 111 000 | 111 000 | 111 000 |
|  |  | Repeat | Repeat |
| $Y_0$(t) | 111 000 | 111 000 | 111 000 |
| $Y_1$(t) | 000 000 | 000 000 | 111 000 |
| X'(t) | 000 111 | 000 111 | 000 111 |
|  |  | Repeat | Repeat |
| $Y_0'$(t) | 000 111 | 000 111 | 000 111 |
| $Y_1'$(t) | 000 000 | 000 000 | 000 111 |

When employing Table 1 to design puncturing patterns for tail output bits, the row designation "Repeat" means that for a rate ⅓ or a rate ¼ turbo code, when transmitted, the bits X and X' are transmitted twice.

For a rate ½ turbo code, the puncturing table is read first from top to bottom, and then from left to right. For a rate ⅓ turbo code and a rate ¼ turbo code, the puncturing table is read first from top to bottom, repeating X(t) and X'(t), and then from left to right.

The puncturing patterns in Table 1 are chosen so that:

(1) A number of transmitted tail output bits during trellis termination is 1/R for each trellis branch wherein R is the turbo code rate employed during information bit transmission. Advantageously, this condition ensures that the same turbo code rate is used for trellis termination as for information bit transmission.

(2) Only output branches of the encoders 10, 10' used during information bit transmission are used for trellis termination. For example, for rate ½ and rate ⅓ turbo coders, only X(t), X'(t), $Y_0$(t) and $Y_0'$(t) are transmitted during information bit transmission; $Y_1$(t) and $Y_1'$(t) are always punctured. Therefore, only X(t), X'(t), $Y_0$(t) and $Y_0'$(t) are transmitted during the trellis termination stage, as well. Advantageously, therefore, if a manufacturer only wanted to implement a rate ½ and encoder, such a manufacturer would only have to implement transmissions of bits from branches X, $Y_0$ or X', $Y_0'$.

(3) In order to meet conditions (1) and (2), it may require repetition of some tail output bits during trellis termination. That is, to both keep the turbo code rate the same, and to only use output branches used in information bit transmission, it may be necessary to repeat one or more of the tail bits for each encoder 10, 10' in order to keep the turbo code rate the same.

In the preferred embodiment illustrated by Table 1, X(t) and X'(t) are selected to be repeated in both the turbo code rate ⅓ and rate ¼ cases. Table 1 may also be employed irrespective of whether the encoders 10, 10' are terminated concurrently or non-concurrently.

Alternative embodiments are envisioned, in keeping within the spirit of the invention wherein another tail output bit is selected to be repeated, such as, for example that corresponding to $Y_0$(t) and $Y_0'$(t).

Alternatively, where a code rate lower than ¼ is employed it may be necessary to repeat more than one tail output bit per encoder 10, 10', in which case an additional tail bit besides X(t) may be repeated, such as repeating X(t) and $Y_0$(t) or repeating X(t) twice or any combination whatsoever.

While the invention herein disclosed has been described by means of specific embodiments and applications thereof, numerous modifications and variations could be made thereto by those skilled in the art without departing from the scope of the invention set forth in the claims.

What is claimed is:

1. A method of terminating two or more constituent encoders of a turbo encoder employing a turbo code, the method comprising the steps of:
   generating tail input bits at each of two or more constituent encoders, including the step of:
      deriving the tail input bits from each of the two or more constituent encoders separately for each constituent encoder from a contents of shift registers within each of the two or more constituent encoders, after an encoding of information bits by the two or more constituent encoders; and
   puncturing one or more tail output bits such that 1/R tail output bits are transmitted for each of a plurality of trellis branches, wherein R is a turbo code rate employed by the turbo encoder during an information bit transmission.

2. The method of claim 1 wherein the step of puncturing the tail output bits further comprises the step of:
   transmitting, during trellis termination, the tail output bits only if they are sent from an output branch of one of the two or more constituent encoders that is used during information bit transmission.

3. The method of claim 2 wherein the step of transmitting comprises the steps of:
   transmitting tail output bits from a first $X(t)$ output branch and from a second $Y_0(t)$ output branch, when the turbo encoder is employed as a rate ½ turbo encoder, during trellis termination of a first of the two or more constituent encoders; and
   transmitting tail output bits from a third $X'(t)$ output branch and from a fourth $Y_0'(t)$ output branch, when the turbo encoder is employed as a rate ½ turbo encoder, during trellis termination of a second of the two or more constituent encoders.

4. The method of claim 2 wherein, when the turbo encoder is employed as a rate ⅓ turbo encoder, the step of transmitting comprises the steps of:
   transmitting tail output bits from a first $X(t)$ output branch, and a second $Y_0(t)$ output branch, during trellis termination of a first of the two or more constituent encoders;
   re-transmitting tail output bits from the first $X(t)$ output branch during trellis termination of the first of the two or more constituent encoders;
   transmitting tail output bits from a third $X'(t)$ output branch and from a fourth $Y_0'(t)$ output branch, during trellis termination of a second of the two or more constituent encoders; and
   re-transmitting tail output bits from the third $X'(t)$ output branch during trellis termination of the second of the two or more constituent encoders.

5. The method of claim 2 wherein, when the turbo encoder is employed as a rate ¼ turbo encoder, the step of transmitting comprises the steps of:
   transmitting tail output bits from a first $X(t)$ output branch, a second $Y_0(t)$ output branch, and a third $Y_1(t)$ output branch during trellis termination of a first of the two or more constituent encoders;
   re-transmitting tail output bits from the first $X(t)$ output branch during trellis termination of the first of the two or more constituent encoders;
   transmitting tail output bits from a fourth $X'(t)$ output branch, a fifth $Y_0'(t)$ output branch, and a sixth $Y_1'(t)$ output branch during trellis termination of a second of the two or more constituent encoders; and
   re-transmitting tail output bits from the fourth $X'(t)$ output branch during trellis termination of the second of the two or more constituent encoders.

6. The method of claim 1 wherein the step of generating the tail input bits is performed simultaneously at each of the two or more constituent encoders, wherein tail input bits from a first constituent encoder are generated at same clock cycles from a second constituent encoder.

7. The method of claim 1 wherein the step of generating the tail input bits is performed consecutively at each of the two or more constituent encoders, wherein tail input bits from a first constituent encoder are generated at different clock cycles than tail input bits from a second constituent encoder.

* * * * *